(12) United States Patent
Powell, III et al.

(10) Patent No.: US 10,389,361 B1
(45) Date of Patent: Aug. 20, 2019

(54) FOUR-INPUT JOSEPHSON GATES

(71) Applicants: Jack R. Powell, III, Los Angeles, CA (US); Alexander L. Braun, Baltimore, MD (US)

(72) Inventors: Jack R. Powell, III, Los Angeles, CA (US); Alexander L. Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/102,385

(22) Filed: Aug. 13, 2018

Related U.S. Application Data (63) Continuation of application No. 15/886,684, filed on Feb. 1, 2018, now Pat. No. 10,103,736.

(51) Int. Cl.
*H03K 19/195* (2006.01)
*G06N 99/00* (2019.01)
(Continued)

(52) U.S. Cl.
CPC ............ *H03K 19/195* (2013.01); *B82Y 10/00* (2013.01); *G06N 10/00* (2019.01); *G11C 11/44* (2013.01); *H01L 39/025* (2013.01); *H03K 19/17708* (2013.01); *H03K 19/1952* (2013.01); *H03K 19/1954* (2013.01); *H03M 7/003* (2013.01)

(58) Field of Classification Search
CPC ........ G06N 99/002; B82Y 10/00; H03K 3/38; H03K 19/195; H03K 17/92; H03K 19/1954; G11C 11/44; G11C 15/06; G11C 19/32; H01L 39/223; H01L 39/025; H01L 39/16
See application file for complete search history.

(56) References Cited

U.S. PATENT DOCUMENTS 3,094,685 A 6/1963 Crowe
4,956,642 A 9/1990 Harada
(Continued)

FOREIGN PATENT DOCUMENTS

| CN | 101626233 | 1/2010 |
| CN | 101626234 | 1/2010 |
| WO | 2008089067 | 7/2008 |

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.
(Continued)

*Primary Examiner* — Vibol Tan
(74) *Attorney, Agent, or Firm* — Tarolli, Sundheim, Covell & Tummino LLP (57) ABSTRACT

Superconducting methods of determining AND, OR, AND-OR, and OR-AND logic values use single flux quantum (SFQ) pulses to assert logical inputs of a reciprocal quantum logic (RQL) gate by placing currents in input storage loops in the RQL gate and, based on the currents in the storage loops, triggering logical decision Josephson junctions (JJs) in the gate, such that an assertion or de-assertion signal corresponding to the logical function of the gate is observed at the output. The methods permit for outputs based on at least four logical inputs to be achieved.

20 Claims, 8 Drawing Sheets

(51) Int. Cl.
*H03K 19/177* (2006.01)
*G11C 11/44* (2006.01)
*H01L 39/02* (2006.01)
*H03M 7/00* (2006.01)
*B82Y 10/00* (2011.01)
*G06N 10/00* (2019.01)

(56) References Cited

U.S. PATENT DOCUMENTS

| | | | |
|---|---|---|---|
| 5,233,243 | A | 8/1993 | Murphy et al. |
| 6,310,488 | B1 | 10/2001 | Hasegawa et al. |
| 6,608,518 | B2 | 8/2003 | Furuta et al. |
| 6,734,699 | B1 | 5/2004 | Herr et al. |
| 6,756,925 | B1 | 6/2004 | Leung et al. |
| 7,129,869 | B2 | 10/2006 | Furuta et al. |
| 7,227,480 | B2 | 6/2007 | Furuta et al. |
| 7,724,020 | B2 | 5/2010 | Herr |
| 7,786,748 | B1 | 8/2010 | Herr |
| 7,903,456 | B2 | 3/2011 | Kirichenko et al. |
| 7,944,253 | B1 | 5/2011 | Kirichenko |
| 7,969,178 | B2 | 6/2011 | Przybysz et al. |
| 7,977,964 | B2 | 7/2011 | Herr |
| 8,138,784 | B2 | 3/2012 | Przybysz et al. |
| 8,489,163 | B2 | 7/2013 | Herr et al. |
| 8,611,974 | B2 | 12/2013 | Maibaum et al. |
| 9,455,707 | B2 | 9/2016 | Herr et al. |
| 9,543,959 | B1 * | 1/2017 | Carmean ............... H03K 19/195 |
| 9,595,970 | B1 * | 3/2017 | Reohr ................. H03K 19/195 |
| 9,646,682 | B1 | 5/2017 | Miller et al. |
| 9,712,172 | B2 | 7/2017 | Shauck et al. |
| 9,780,765 | B2 | 10/2017 | Naaman et al. |
| 9,812,192 | B1 | 11/2017 | Burnett et al. |
| 9,876,505 | B1 | 1/2018 | Dai et al. |
| 9,887,700 | B2 | 2/2018 | Carmean et al. |
| 9,905,900 | B2 | 2/2018 | Herr et al. |
| 9,917,580 | B2 | 3/2018 | Naaman |
| 9,972,380 | B2 | 5/2018 | Ambrose |
| 10,084,454 | B1 * | 9/2018 | Braun .................. H03K 19/195 |
| 10,112,352 | B2 * | 10/2018 | Starkey ................ B29C 70/345 |
| 10,147,484 | B1 * | 12/2018 | Braun ................ H03K 19/1954 |
| 10,158,348 | B1 * | 12/2018 | Braun .................. H01L 39/045 |
| 10,158,363 | B1 * | 12/2018 | Braun ................ H03K 19/1954 |
| 10,171,087 | B1 * | 1/2019 | Braun .................. H03K 19/195 |
| 2003/0011398 | A1 | 1/2003 | Herr |
| 2003/0016069 | A1 | 1/2003 | Furuta et al. |
| 2009/0002014 | A1 | 1/2009 | Gupta |
| 2009/0153180 | A1 | 6/2009 | Herr |
| 2011/0133770 | A1 | 6/2011 | Przybysz et al. |
| 2015/0254571 | A1 | 9/2015 | Miller |
| 2016/0164505 | A1 | 6/2016 | Naaman et al. |
| 2017/0359072 | A1 | 12/2017 | Hamilton et al. |

OTHER PUBLICATIONS

International Written Opinion and Search Report corresponding to International Application No. PCT/US2018/056310 dated Jan. 22, 2019.

International Written Opinion and Search Report corresponding to International Application No. PCT/US2018/056316 dated Jan. 25, 2019.

International Written Opinion and Search Report corresponding to International Application No. US/PCT2018/056305 dated Jan. 30, 2019.

Narendran, S. et al.: "Quantum computation based on Reciprocal Quantum logic", 2017 International Conference on Nextgen Electronic Technologies; Silicon to Software (ICNETS2), IEEE, Mar. 23, 2017 (Mar. 23, 2017), pp. 34-37 Retrieved on Oct. 13, 2017. p. 25, right hand column, paragraph 1; figures 6,7.

Kotani S. et al.: "Ultrahigh-speed logic gate family with Nb/Al-A1O x / Nb Josephson junctions", IEEE Transactions on Election Devices, vol. 33, No. 3, Mar. 1, 1986 (Mar. 1, 1986), pp. 379-384.

\* cited by examiner

FOUR-INPUT JOSEPHSON GATES

CROSS-REFERENCE TO RELATED APPLICATION

This application is a continuation application claiming priority from U.S. patent application Ser. No. 15/886,684, filed 1 Feb. 2018, which is incorporated herein in its entirety.

TECHNICAL FIELD

The present invention relates generally to quantum and classical digital superconducting circuits, and specifically to four-input Josephson gates.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

SUMMARY

One example includes a four-input Josephson gate circuit with first and second stages. The first stage has four logical inputs each configured to be asserted based on receiving a positive single flux quantum (SFQ) pulse. It includes first, second, third, and fourth logical input storage loops. Each logical input is associated with one of the logical input storage loops. Each storage loop includes two Josephson junctions (JJs) and a storage inductor. The second stage includes fifth and sixth storage loops and an output. It is configured to receive signals from the first stage and to produce an output signal on the output. A first logical decision JJ is common to the first and second logical input storage loops and the fifth storage loop, and triggers based on biasing provided by one or more currents stored in the first and second logical input storage loops and a first bias signal. A second logical decision JJ is common to the third and fourth logical input storage loops and the sixth storage loop, and triggers based on biasing provided by one or more currents stored in the third and fourth logical input storage loops and a second bias signal. A third logical decision JJ common to the fifth and sixth storage loops triggers and thereby asserts the output based on biasing provided by one or more currents stored in the fifth and sixth storage loops and a third bias signal.

Another example includes a method of determining a logic value based on four logical inputs. One or more positive SFQ pulses are provided to assert one or more logical inputs of a reciprocal quantum logic (RQL) gate having four logical inputs. One or more positive currents are thereby placed in one or more input storage loops in the RQL gate. The RQL gate has four such storage loops. A first of three logical decision JJs in the RQL gate is thereby triggered. A cascaded logical decision JJ in the RQL gate is thereby triggered. An assertion signal is thereby propagated from an output of the RQL gate.

Yet another example includes a circuit with first and second stages. In the first stage, first and second logical input Josephson transmission line (JTL) branches join at a first dovetail node to form a fifth branch, and third and fourth logical input JTLs join at a second dovetail node to form a sixth branch. Each logical input JTL includes a storage loop input inductor connected, at a respective first node, to an input JJ and a storage inductor. The storage loop input inductor, input JJ, and storage inductor of each logical input JTL is sized to provide unidirectional data flow. A first logical decision JJ is connected between the first dovetail node and a circuit ground, such that respective first and second storage loops are formed by the input JJ and storage inductor of each of the first and second input JTLs and the first logical decision JJ. A second logical decision JJ is connected between the second dovetail node and the circuit ground, such that respective third and fourth storage loops are formed by the input JJ and storage inductor of each of the third and fourth input JTLs and the second logical decision JJ. In the second stage, a third logical decision JJ is connected between, on the one hand, a third dovetail node joining the fifth and sixth branches and, on the other hand, the circuit ground. A fifth storage loop is thereby formed by the first logical decision JJ, a fifth storage inductor in the fifth branch, and the third logical decision JJ. A sixth storage loop is also thereby formed by the second logical decision JJ, a sixth storage inductor in the sixth branch, and the third logical decision JJ. The circuit provides an asserted or de-asserted logical output signal at an output node based on asserted or de-asserted logical input signals provided to the logical input JTLs, respectively.

BRIEF DESCRIPTION OF THE DRAWINGS

FIG. 2A is a circuit diagram of an example four-input AND gate, the logical function of which is shown symbolically in FIG. 2B.

FIG. 3A is a circuit diagram of an example four-input OR gate, the logical function of which is shown symbolically in FIG. 3B.

FIG. 4A is a circuit diagram of an example four-input AND-OR gate, the logical function of which is shown symbolically in FIG. 4B.

FIG. 5A is a circuit diagram of an example four-input OR-AND gate, the logical function of which is shown symbolically in FIG. 5B.

DETAILED DESCRIPTION

This disclosure relates generally to logical gate circuits useful, for example, in reciprocal quantum logic (RQL)

systems, and related methods. This disclosure more specifically relates to such gates having four inputs, including AND gates, OR gates, AND-OR (AO22) gates, and OR-AND (OA22) gates. The disclosure more specifically provides a family of four-input logic gates that each utilize a distributed decision Josephson junction and cascadable RQL logic functions.

Figure 1:
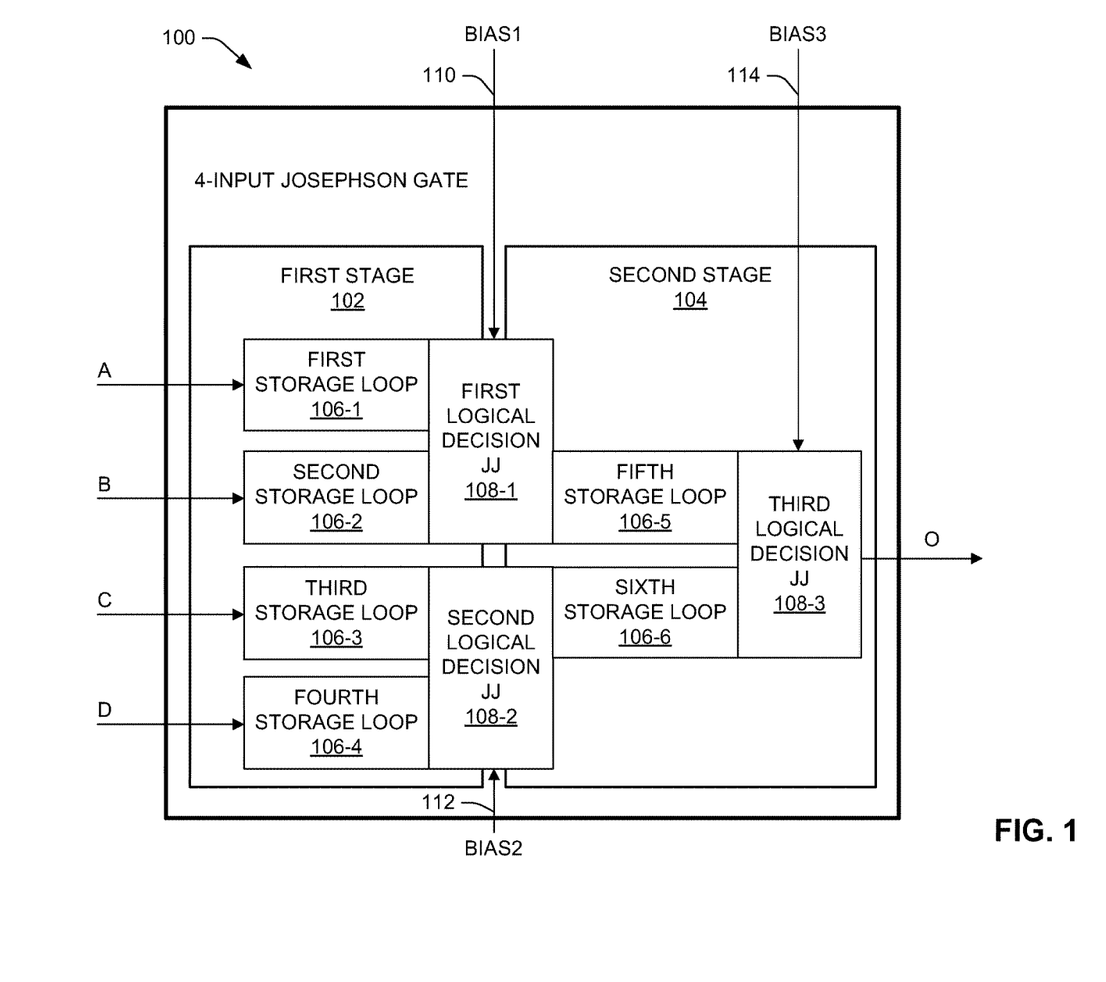
FIG. 1 is a block diagram of an example four-input Josephson gate.

FIG. 1 shows a four-input Josephson gate 100 having four logical inputs A, B, C, D, and output O. Gate 100 includes first stage 102, configured to receive inputs A, B, C, D, which can consist of positive or negative single flux quantum (SFQ) pulses corresponding to asserted or de-asserted logic states, respectively. Gate 100 further includes second stage 104, configured to provide output O, which also can consist of positive or negative SFQ pulses corresponding to asserted or de-asserted logic states, respectively. Each logical input A, B, C, D has associated with it at least one storage loop among storage loops 106-1 through 106-4. Although first stage 102 is illustrated as having one storage loop per input, each input can have more than one storage loop associated with it.

First logical decision Josephson junction (JJ) 108-1 is common to (i.e., shared by) first and second input storage loops 106-1, 106-2, and triggers based on inputs A, B. Second logical decision JJ 108-2 is common to (i.e., shared by) third and fourth input storage loops 106-3, 106-4, and triggers based on inputs C, D. Second stage 104 includes fifth and sixth storage loops 106-5, 106-6. Fifth storage loop 106-5 is made up of first logical decision JJ 108-1 as well as third logical decision JJ 108-3. Sixth storage loop 106-6 is made up of second logical decision JJ 108-2 as well as third logical decision JJ 108-3. Third logical decision JJ 108-3 is common to (i.e., shared by) fifth and sixth storage loops 106-5, 106-6, and triggers based on the triggering of either or both of first and second logical decision JJs 108-1, 108-2.

The assertion or de-assertion of output O of four-input gate 100 can be based on the triggering of third logical decision JJ 108-3. Depending on the configuration of gate 100, the assertion or de-assertion of output O can be based on any, some, or all of inputs A, B, C, D. For example, output O can propagate a positive SFQ pulse corresponding to an asserted output logic state and a negative SFQ pulse corresponding to a de-asserted output logic state. As examples, four-input gate 100 can be configured as an AND gate, an OR gate, an OR-AND gate, or an AND-OR gate. Second stage 104 can include an output Josephson transmission line (JTL) (not shown in FIG. 1) to amplify the output of third logical decision JJ 108-3.

The triggering of first logical decision JJ 108-1 can be based not only on inputs A, B, but also on a first bias signal BIAS1 provided to first logical decision JJ 108-1 via first bias line 110. Similarly, the triggering of second logical decision JJ 108-2 can be based not only on inputs C, D, but also on a second bias signal BIAS2 provided to second logical decision JJ 108-2 via second bias line 112. Likewise, the triggering of third logical decision JJ 108-3 can be based not only on the states of first logical decision JJ 108-1 and second logical decision JJ 108-2, but also on a third bias signal provided to third logical decision JJ 108-3 via third bias line 114. Bias signals BIAS1, BIAS2, BIAS3 provided on bias lines 110, 112, 114 can provide both AC and DC bias. Thus, for example, bias signals provided on lines 110, 112, 114 can act as clocks to Josephson gate 100, causing the evaluation of the inputs A, B, C, D to produce the output O at certain points in time according to the AC components of bias signals BIAS1, BIAS2, BIAS3. In some examples, first and second bias signals provided on lines 110, 112 can have the same AC phase while third bias signal provided on line 114 can have an AC phase that is different from the AC phase of the first and second bias signals, e.g., 180° out of phase with the first and second bias signals.

Figures 2A, 2B:
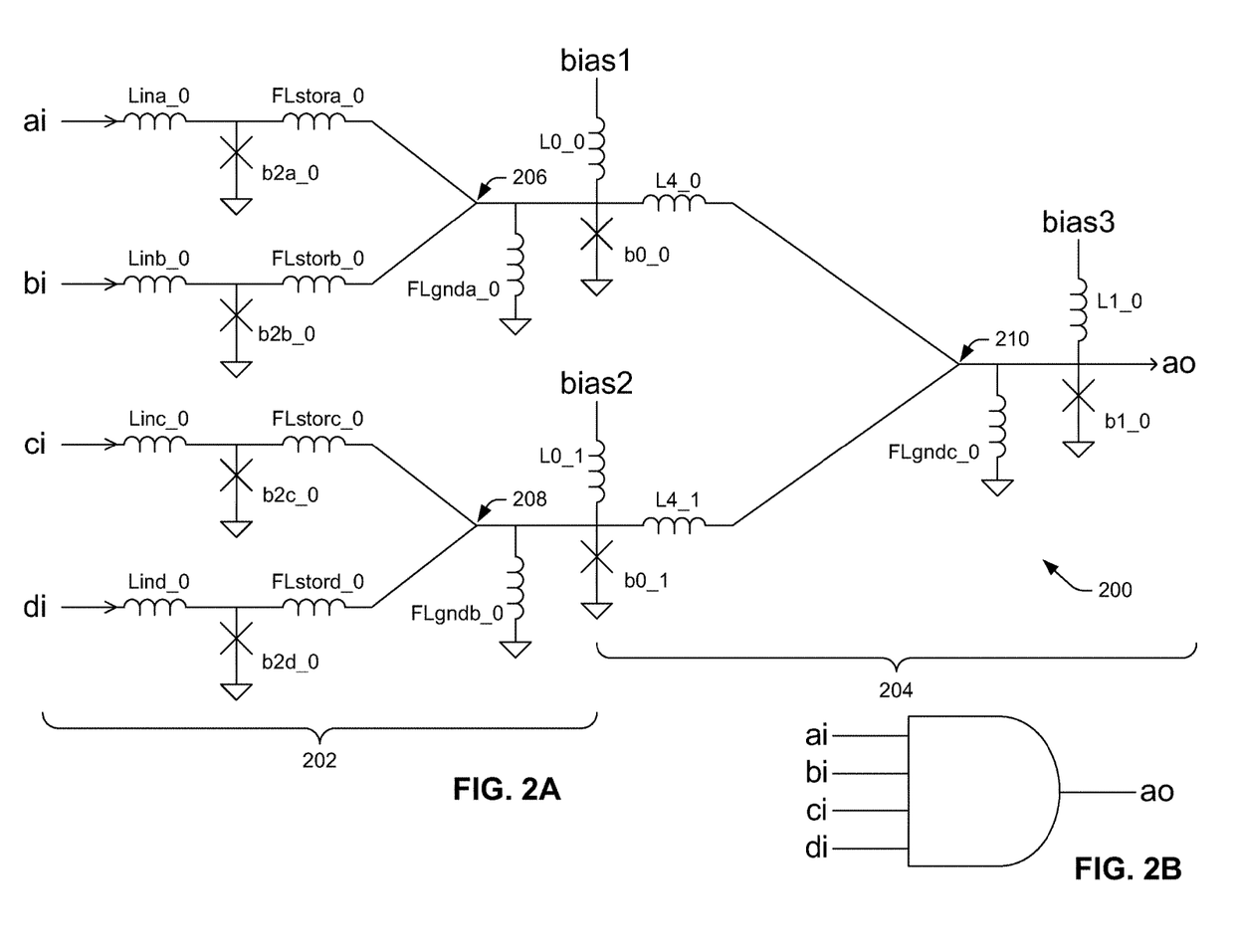

FIG. 2A illustrates a four-input AND RQL gate that performs a logical function illustrated symbolically in FIG. 2B, showing a single four-input AND gate. First stage 202 can correspond to first stage 102 in FIG. 1 and second stage 204 can correspond to second stage 104 in FIG. 1. In first stage 202, each input ai, bi, ci, di is provided via a respective one of leading inductors Lina_0, Linb_0, Linc_0, Lind_0. These leading inductors each allow a corresponding input to be connected to a driving JTL or to the output of another gate.

First stage 202 has two JTL input branches corresponding to inputs ai, bi that join at first dovetail node 206. Together with first logical decision JJ b0_0, these two input branches form storage loops to separately receive and store inputs ai, bi until a first logical decision can be made, i.e., until a first logic condition is met. A first storage loop corresponding to input ai is made up of first input JJ b2a_0, first storage inductor FLstora_0, and first logical decision JJ b0_0. A second storage loop corresponding to input bi is made up of second input JJ b2b_0, second storage inductor FLstorb_0, and first logical decision JJ b0_0. Thus, first logical decision JJ b0_0 is common to both the first and second storage loops.

First stage 202 further has two more JTL input branches corresponding to inputs ci, di that join at second dovetail node 208. Together with second logical decision JJ b0_1, these two input branches form storage loops to separately receive and store inputs ci, di until a second logical decision can be made, i.e., until a second logic condition is met. A third storage loop corresponding to input ci is made up of third input JJ b2c_0, third storage inductor FLstorc_0, and second logical decision JJ b0_1. A fourth storage loop corresponding to input di is made up of fourth input JJ b2d_0, fourth storage inductor FLstord_0, and second logical decision JJ b0_1. Thus, second logical decision JJ b0_1 is common to both the third and fourth storage loops. First stage 202 narrows from four input branches to two intermediate branches.

Second stage 204 combines the outputs of these two intermediate branches to further narrow to a single output branch at dovetail node 210. Together with third logical decision JJ b1_0, the two intermediate branches form fifth and sixth storage loops to separately receive and store the two intermediate outputs of the first stage 202 until a third logical decision can be made, i.e., until a third logic condition is met. A fifth storage loop storing the intermediate result of the first logic decision made with regard to inputs ai, bi is made up of first logical decision JJ b0_0, fifth storage inductor L4_0, and third logical decision JJ b1_0. A sixth storage loop storing the intermediate result of the second logic decision made with regard to inputs ci, di is made up of second logical decision JJ b0_1, sixth storage inductor L4_1, and third logical decision JJ b1_0. Thus, first logical decision JJ b0_0 is common to all three of the first, second, and fifth storage loops, second logical decision JJ b0_1 is common to all three of the third, fourth, and sixth storage loops, and third logical decision JJ b1_0 is common to both of the fifth and sixth storage loops.

In gate circuit 200, first AC and DC bias input bias1 is provided to first logical decision JJ b0_0 via first bias inductor L0_0, second AC and DC bias input bias2 is provided to second logical decision JJ b0_1 via second bias inductor L0_1, and third AC and DC bias input bias3 is provided to third logical decision JJ b1_0 via third bias inductor L1_0. Output ao may also be connected to a JTL or to the input of another gate, for example, to propagate a positive output pulse representing the assertion of gate 200 to logical "high." A subsequent negative output pulse propagated from output ao can then represent the de-assertion of gate 200 to logical "low."

The selections of component sizes in each storage loop provide a unidirectional data flow, i.e., from left to right of the circuit 200 as illustrated in FIG. 2A. Circuit 200 operates on SFQ pulses, which each place one $\Phi_0$ (about 2.07 mA pH) of current into a storage loop. The magnitude of current through such a storage loop is determined by the size of the storage inductor in the storage loop. Thus, for each input, the inductance value of the leading inductor (e.g., Lina_0) can be small (e.g., between about 8 pH and 9 pH, e.g., 8.5 pH) in comparison to the inductance value of the storage inductor (e.g., FLstora_0). On the other hand, the storage inductor can sized to be relatively large (e.g., between about 30 pH and 40 pH, e.g., 35 pH) (e.g., about four times larger than the corresponding leading inductor) to reduce the magnitude of the stored current induced by an input SFQ pulse. In some examples, the magnitude of a current introduced at an input (e.g., ai) is about four times larger than the current stored in a storage loop. The input JJ for input ai, b2a_0, is also sized such that the driving JTL is capable of triggering this JJ to put current into the corresponding storage loop, but the current in the storage loop is never sufficient to untrigger input JJ b2a_0 and allow the stored pulse to back out of the input. The storage loops associated with inputs bi, ci, and di can have the same structure as the storage loop for input ai, and thus can have the same unidirectional flow properties.

The logical decision JJs b0_0, b0_1, b1_0 perform the logic function of the gate 200. The combination of any two inputs, plus the bias bias_1, bias2, or bias3, is sufficient to switch the corresponding logical decision JJ b0_0, b0_1, or b1_0 in either direction. An AC component (e.g., a sine wave component) of any of bias signals bias_1, bias2, bias3 in gate 200 of FIG. 2A can act as a clock signal to gate 200, which can evaluate the logical inputs twice per cycle of the clock signal. The AC phase of each bias signal can have alternating positive and negative portions. During the positive portion of the AC phase, the corresponding logical decision JJ evaluates its connected inputs to decide whether its output should be asserted; during the negative portion of the AC phase, the corresponding logical decision JJ evaluates inputs to decide whether its output should be de-asserted. Thus, output ao is only ever asserted on the positive portion of the AC phase of bias signal bias3 and is only ever de-asserted on the negative portion of the AC phase of bias signal bias3.

Each logical decision JJ b0_0, b0_1, b1_0 in gate circuit 200 performs a majority function on the basis of two logical inputs and a third pseudo-input tied to a low voltage rail (e.g., ground) that functions as an immutable logical "0." First logical decision JJ b0_0 triggers, on the positive phase portion of bias signal bias1, when a majority two out of three of its inputs have been asserted, those inputs consisting of ai, bi, and the permanent "0" from third branch consisting of inductor FLgnda_0. Because a two-of-three majority is required for assertion and one "input" is always "0," first logical decision JJ b0_0 only triggers when both ai and bi have been asserted. First logical decision JJ b0_0 untriggers, on the negative phase portion of bias signal bias1, when less than a majority two out of three of its inputs have been asserted. Thus, first logical decision JJ b0_0 untriggers when either ai or bi have been de-asserted. Second logical decision JJ b0_1 functions similarly based on its logical inputs ci, di, and its bias signal bias2. Third logical decision JJ b1_0 functions similarly based on the outputs of first and second logical decision JJs b0_0, b0_1 and bias signal bias3. Accordingly, the correct four-input AND logical functionality is produced at output ao.

Inductor FLgnda_0 can be somewhat larger than the other storage inductors FLstora_0, FLstorb_0 to compensate for the eliminated parasitic input inductance that results from having no input JJ associated with that branch. For example, in gate 200, the inductance value of inductor FLgnda_0 can be between about 32 pH and 42 pH, e.g., 36 pH.

The sequence of events in gate circuit 200 that occur when a single input is asserted will now be described. An input pulse, e.g., a single flux quantum (SFQ) pulse, arrives at input ai. This induces superconducting current through leading inductor Lina_0 and input JJ b2a_0. This current in turn triggers input JJ b2a_0, raising its superconducting phase from 0 to $2\pi$. The triggering of input JJ b2a_0 induces an equal and opposite current (e.g., one $\Phi_0$ worth of current) in leading inductor Lina_0, annihilating the initial input current, and also induces a superconducting current in the first storage loop formed by input JJ b2a_0, first storage inductor FLstora_0, and first logical decision JJ b0_0. This first storage loop current alone is insufficient to trigger logical decision JJ b0_0, and will remain trapped indefinitely in the first storage loop if no further inputs are applied. A negative input pulse arriving at input ai would reverse the above-described effects, annihilating the positive current stored in the first storage loop with an equal and opposite current, thus returning the circuit to its initial state. Logical inputs bi, ci, and di operate in the same manner.

A positive current stored in the first storage loop is, by itself, insufficient to trigger logical decision JJ b0_0, even with the AC and DC bias bias1, not only because logical decision JJ b0_0 may be a larger JJ than the JJs preceding it in circuit 200, but also because of the majority structure of circuit 200. The additional load presented to logical decision JJ b0_0 by the components associated with unasserted logical inputs bi and grounded pseudo-input through FLgnda_0 inhibits logical decision JJ b0_0 from triggering. Thus, assertion of a majority of inputs is required to cause b0_0 to trigger.

When logical input bi is asserted following the assertion of logical input ai, e.g., by introducing another positive SFQ pulse to the bi input, another positive current is made to circulate in the second storage loop formed by input JJ b2b_0, second storage inductor FLstorb_0, and first logical decision JJ b0_0. Then, both of input JJs b2a_0 and b2b_0 are in the $2\pi$ state. Both loop currents, induced by respective positive input pulses, will persist in their respective storage loops until a subsequent negative pulse on the respective input removes the corresponding loop current, or until the clocking function of the AC component of bias signal bias1 triggers logical decision JJ b0_0 to transform the inputs into an output. Because of this storage functionality, inputs needed to amount to a majority number of input assertions need not arrive within the same clock cycle.

Both of these input loop currents bias first logical decision JJ b0_0 towards a positive transition, but due to the size of input loop storage inductors FLstora_0 and FLstorb_0, these currents are insufficient to cause this transition without additional bias current provided by the AC and DC bias signal bias_1. When the AC component of this bias signal has reached sufficient positive magnitude, i.e., when first logical decision JJ b0_0 is positively "clocked," first logical decision JJ b0_0 triggers. The stored positive currents in the first and second storage inductors FLstora_0, FLstorb_0 are annihilated by resultant equal and opposite currents. Additionally, a positive current is placed into fifth storage loop via fifth storage inductor L4_0 and third logical decision JJ b1_0.

Second logical decision JJ b0_1 functions similarly to place a positive current into sixth storage loop via sixth storage inductor L4_1 and third logical decision JJ b1_0 based on assertions of logical inputs ci and di and the positive clocking function of second bias signal bias2. The stored currents in the fifth and sixth storage loops, in combination with the AC component of bias signal bias3, trigger third logical decision JJ b1_0, sending a positive SFQ pulse out of output ao, asserting the output and providing the correct four-input logical AND function for gate 200. As well, this triggering of third logical decision JJ b1_0 annihilates the stored positive currents in inductors L4_0 and L4_1.

A single negative pulse arriving at any of the initially asserted inputs ai, bi, ci, or di will provide a negatively biasing current in a corresponding storage loop, such that in combination with the respective AC and DC biases they will unflip corresponding first or second logical decision JJs b0_0 or b0_1 by causing such JJ to transition out of its $2\pi$ phase. This de-assertion propagates through to a similar de-assertion of third logical decision JJ b1_0, thereby de-asserting the output ao of gate 200 back to logical "low." This will occur when the AC component of bias signal bias3 has reached sufficient negative magnitude.

Gate 200 shows the case where grounding one of three inputs of a two-of-three majority structure (effectively tying this third input, or pseudo-input, to logical "low") creates a two-input AND structure with the two remaining inputs (the logical inputs), and two such majority structures can be tied together, at third dovetail node 210, with a third grounded pseudo-input (via inductor FLgndc_0 in circuit 200) to result, ultimately, in a four-input AND gate. Using a DC bias to induce one $\Phi_0$ (i.e., one SFQ pulse) of current on one of the pseudo-inputs (effectively tying it to logical "high") in the three-input majority structure, instead of grounding one of the pseudo-inputs as in circuit 200, creates a two-input OR structure from the remaining two logical inputs. A four-input OR gate 300, as shown in FIG. 3A, can be constructed accordingly, with the appropriate modification of the four-input AND gate 200 of FIG. 2A.

Figures 3A, 3B:
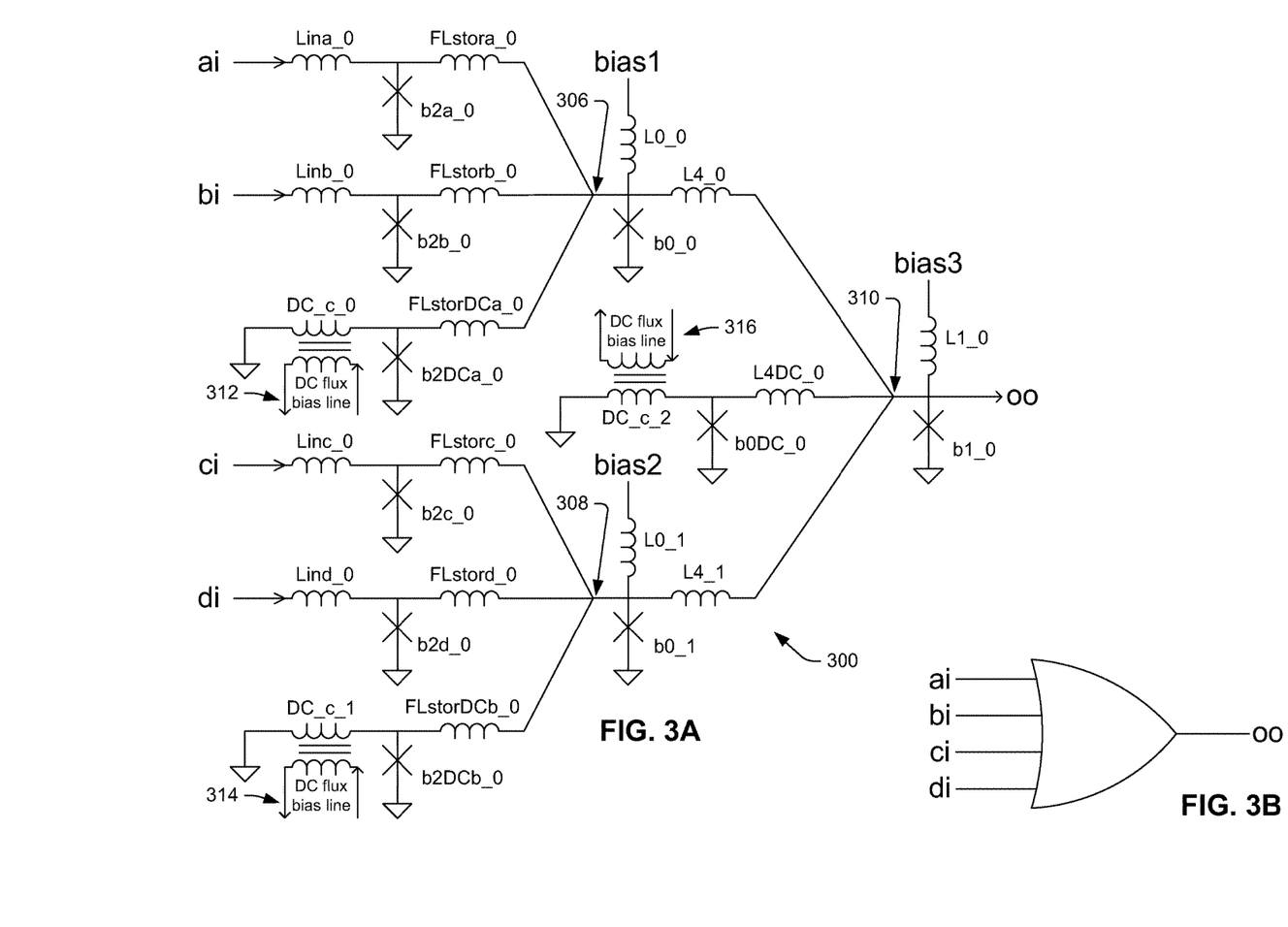

Following from the above description, FIG. 3A shows example four-input OR gate 300, in which output oo is asserted if any one or more of inputs ai, bi, ci, or di are asserted. Thus, gate 300 performs a logical function illustrated symbolically in FIG. 3B, showing a single four-input OR gate. In the illustrated configuration, whereas circuit 200 ties pseudo-input branches to a circuit ground, circuit 300 introduces bias quantizing JJs b2DCa_0, b2DCb_0, b0DC_0 between transformer-coupled input inductors DC_c_0, DC_c_1, DC_c_2 and substitute storage inductors FLstorDCa_0, FLstorDCb_0, and L4DC_0, respectively. Transformer-coupled input inductors DC_c_0, DC_c_1, DC_c_2 are transformer-coupled to respective DC flux bias lines 312, 314, 316. Bias quantizing JJs b2DCa_0, b2DCb_0, b0DC_0 each quantize the DC bias current supplied through transformer-coupled input inductors DC_c_0, DC_c_1, DC_c_2, respectively, and improve operating margins.

Thus, each logical decision JJ b0_0, b01, b1_0 in four-input OR gate 300 effectively considers, in addition to the states of two respective logical inputs, a third input, referred to herein as a pseudo-input, that biases its respective logical decision JJ toward triggering and thereby presents an immutable logical "1," effectively transforming the majority function of each of the three "three"-input structures into a two-input OR structure. This differs from four-input AND gate 200 in which each logical decision JJ b0_0, b01, b1_0 effectively considers, in addition to the states of two respective logical inputs, a third input, or pseudo-input, that biases its respective logical decision JJ against triggering and thereby presents an immutable logical "0," effectively transforming the majority function of each of the three "three"-input structures of gate 200 into a two-input AND structure.

The pseudo-inputs illustrated in FIG. 3A function as follows. DC current provided through any of DC flux bias lines 312, 314, 316 stays constant throughout system operation. At system start-up, the DC current through DC flux bias lines 312, 314, 316 couple current into input inductors DC_c_0, DC_c_1, DC_c_2 to which they are transformer-coupled, via the AC transient that occurs at system power-up. This triggers bias quantizing JJs b2DCa_0, b2DCb_0, b0DC_0 once at the beginning of operation, putting a positive current into each of substitute storage inductors FLstorDCa_0, FLstorDCb_0, and L4DC_0.

Figures 4A, 4B:
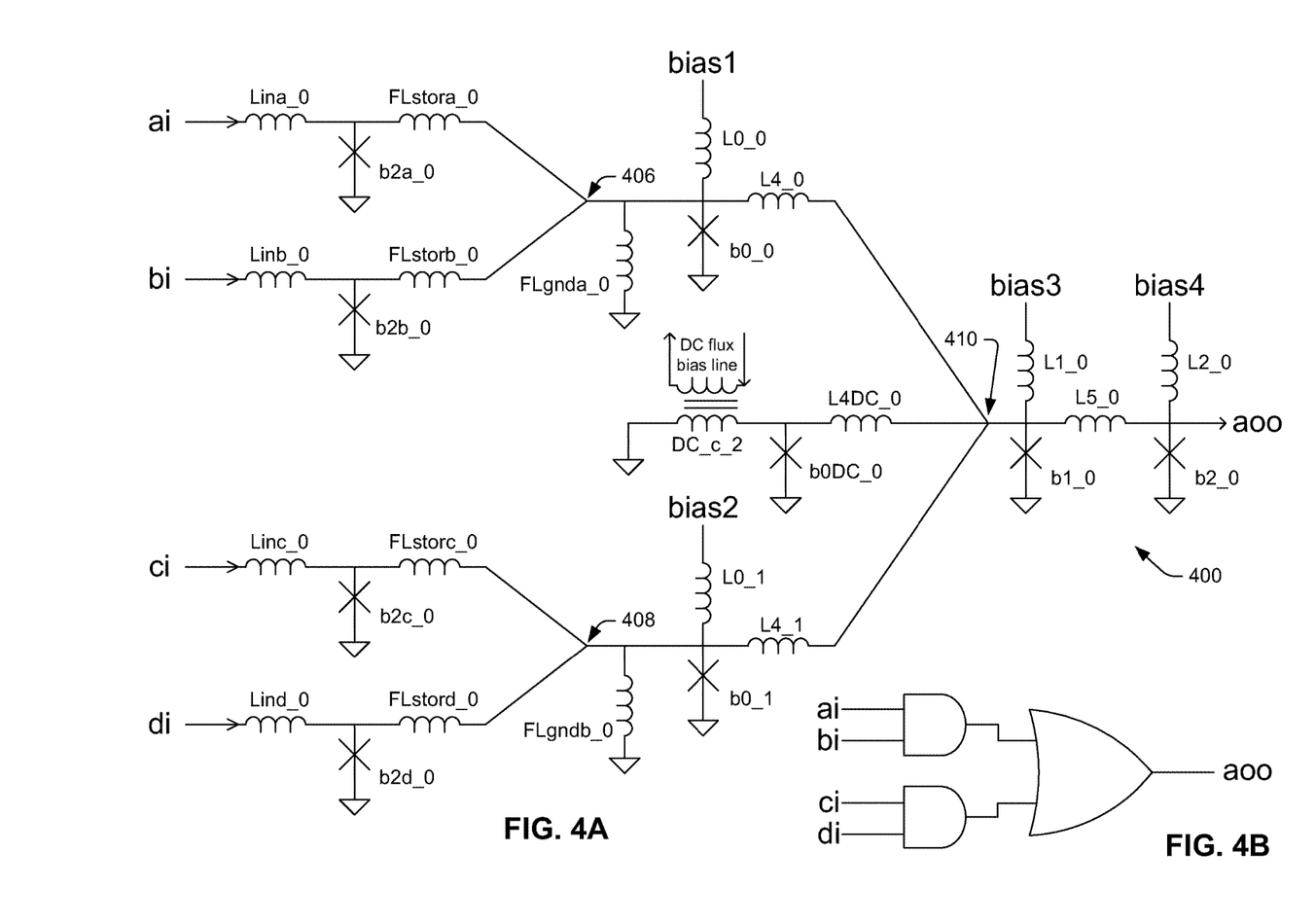
Figures 5A, 5B:
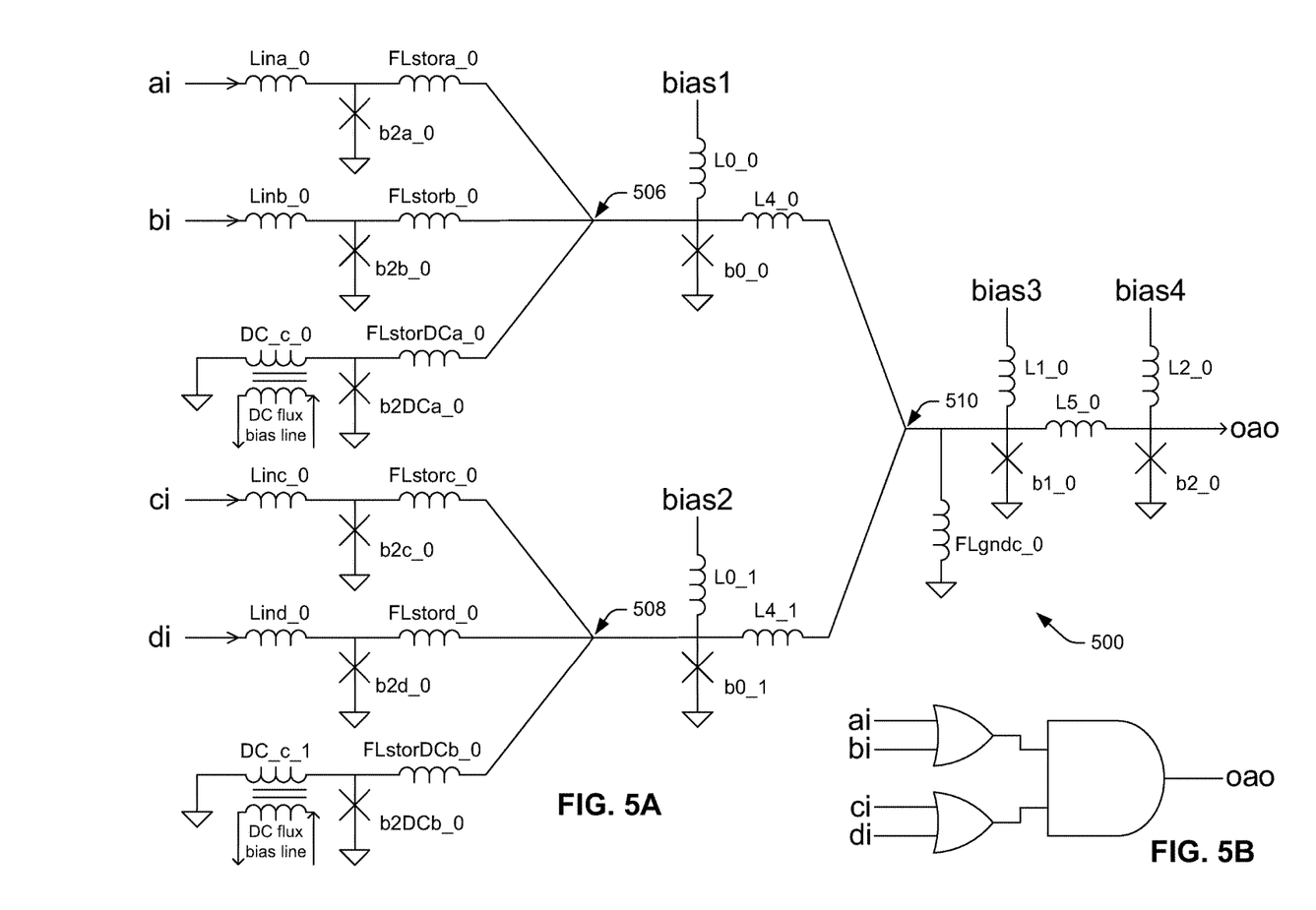

Any or all of the pseudo-inputs used to present an immutable logical "high" illustrated in gate circuits 300, 400, or 500 of FIG. 3A, 4A, or 5A could be realized differently than as shown in FIG. 3A. As one example, the quantizing JJ (e.g., b2DCa_0, b2DCb_0, b0DC_0) and the separate substitute storage inductor (e.g., FLstorDCa_0, FLstorDCb_0, L4DC_0) could be omitted such that DC flux is transformer-coupled into an inductor in the pseudo-input branch (e.g., DC_c_0, DC_c_1, DC_c_2) and that inductor serves as the substitute storage inductor in the pseudo-input branch. Thus, the pseudo-input in any or each majority structure can be initialized with application of one $\Phi_0$ of current directly via the transformer coupling to the DC current. As another example, in any logical "high" pseudo-input instance, an inductor transformer-coupled to a DC flux bias line can placed in parallel with a quantizing JJ, both of which can be configured in series with the substitute storage inductor (e.g., FLstorDCa_0, FLstorDCb_0, L4DC_0) so as to provide the aforementioned initializing current. Thus, the "high" pseudo-input in any or each majority structure can be initialized with application of one $\Phi_0$ of current indirectly, via the transformer and quantizing JJ. The initialization can also be performed by any other suitable mechanism.

The circuit 300 having been so initialized, first logical decision JJ b0_0 in OR gate 300 of FIG. 3A then effectively sees "one" out of "three" inputs asserted, the "one" asserted input being the non-logical, pseudo-input initiated by the DC bias on flux bias line 312, and triggers in response to at least one asserted input among logical inputs ai or bi (and the clocking function of bias1). Upon such triggering, the positive current in first substitute storage inductor FLstorDCa_0 is annihilated, b2DCa_0 does not untrigger, positive currents in storage inductors FLstora_0 or FLstorb_0 are annihilated should the inputs associated with those storage inductors have been asserted, negative currents are induced in the storage inductors associated with any unasserted input among ai or bi, and a positive current is placed into the fifth storage loop formed by first logical decision JJ b0_0, fifth storage inductor L4_0, and third logical decision JJ b1_0.

Thereafter, if negative pulses are applied to de-assert all of previously asserted inputs among logical inputs ai or bi, the negative currents stored in the storage loops associated with the ai, bi logical inputs combine to bias first logical decision JJ b0_0 to untrigger upon the next negative portion of the AC component of the bias signal bias1, which in turn propagates a negative pulse into the fifth storage loop comprising fifth storage inductor L4_0. This untriggering of first logical decision JJ b0_0 restores the positive current to substitute storage inductor FLstorDCa_0, bringing the upper-left portion of circuit 300 back to its initial state, i.e., the state following start-up injection of initial positive current into substitute storage inductor FLstorDCa_0 via DC flux bias line 312.

Similarly, after system-start-up, second logical decision JJ b0_1 in OR gate 300 of FIG. 3A effectively sees "one" out of "three" inputs asserted, the "one" asserted input being the non-logical, pseudo-input initiated by the DC bias on flux bias line 314, and triggers in response to at least one asserted input among logical inputs ci or di (and the clocking function of bias2). Upon such triggering, the positive current in second substitute storage inductor FLstorDCb_0 is destroyed, b2DCb_0 does not untrigger, positive currents in storage inductors FLstorc_0 or FLstord_0 are destroyed should the inputs associated with those storage inductors have been asserted, negative currents are induced in the storage inductors associated with any unasserted input among ci or di, and a positive current is placed into the sixth storage loop formed by second logical decision JJ b0_1, sixth storage inductor L4_1, and third logical decision JJ b1_0.

Thereafter, if negative pulses are applied to de-assert all of previously asserted inputs among logical inputs ci or di, the negative currents stored in the storage loops associated with the cd, di logical inputs combine to bias second logical decision JJ b0_1 to untrigger upon the next negative portion of the AC component of the bias signal bias2, which in turn propagates a negative pulse into the sixth storage loop comprising sixth storage inductor L4_1. This untriggering of second logical decision JJ b0_1 restores the positive current to substitute storage inductor FLstorDCb_0, bringing the lower-left portion of circuit 300 back to its initial state, i.e., the state following start-up injection of initial positive current into substitute storage inductor FLstorDCb_0 via DC flux bias line 314.

The triggering and untriggering of third logical decision JJ b1_0 in OR gate circuit 300 works similarly to as described above with first and second logical decision JJs b0_0 and b0_1. After system start-up and injection of a current into third substitute storage inductor L4DC_0, the majority structure associated with third logical decision JJ b1_0 sees "one" of "three" inputs asserted and therefore only requires one the remaining inputs associated with first or second logical decision JJs b0_0 or b0_1 to be asserted in order to have a majority "two" of "three" assertions and thus to cause the triggering of third logical decision JJ b1_0 (in conjunction with the clocking function of bias3) and send an SFQ pulse out of output oo to assert it. De-assertion also works substantially as described above, when both first or second logical decision JJs b0_0 and b0_1 are de-asserted (again in conjunction with the clocking function of bias3). The correct logical function of a four-input OR gate is thereby achieved in circuit 300.

FIG. 4A shows an example four-input AND-OR (AO) gate 400, specifically, an AO22 gate, constructed based on the previously described topologies, to produce the functionality symbolically shown in FIG. 4B. Conceptually, AO22 gate 400 is an OR gate having its inputs provided by the outputs of AND gates. Accordingly, the first stage of AO22 gate 400 is identical to the first stage 202 of gate 200 (providing AND functionality) whereas the second stage of AO22 gate 400 is identical to the second stage of gate 300 (providing OR functionality). These stages operate substantially as previously described in this disclosure, with the triggering of first-stage logical decision JJs b0_0, b0_1 being influenced not only by logical inputs ai, bi and ci, di, respectively, but also by immutable "0" pseudo-inputs provided through inductors FLgnda_0 and FLgndb_0, respectively, and with the triggering of second-stage logical decision JJ b1_0 being influenced not only by the outputs of the first-stage logical decision JJs, but also by the immutable "1" pseudo-input provided through inductor L4DC_0. AO22 gate 400 further includes an additional JTL component at its output consisting of inductor L5_0, JJ b2_0, and bias signal bias4 provided via inductor L2_0, to provide additional amplification.

Conversely, FIG. 5A shows an example four-input OR-AND (OA) gate, specifically, an OA22 gate, constructed based on the previously described topologies, to produce the functionality symbolically shown in FIG. 5B. Conceptually, OA22 gate 500 is an AND gate having its inputs provided by the outputs of OR gates. An OA22 gate thus provides an asserted output only when all of the inputs to its conceptual AND stage are asserted, in turn requiring that that at least one of the inputs to each of its conceptual OR stages is asserted. Accordingly, the first stage of OA22 gate 500 is identical to the first stage of gate 300 (providing OR functionality) whereas the second stage of OA22 gate 500 is identical to the second stage 204 of gate 200 (providing AND functionality). These stages operate substantially as previously described in this disclosure, with the triggering of first-stage logical decision JJs b0_0, b0_1 being influenced not only by logical inputs ai, bi and ci, di, respectively, but also by immutable "1" pseudo-inputs provided through inductors FLstorDCa_0 and FLstorDCb_0, respectively, and with the triggering of second-stage logical decision JJ b1_0 being influenced not only by the outputs of the first-stage logical decision JJs, but also by the immutable "0" pseudo-input provided through inductor FLgndc_0. OA22 gate 500 further includes an additional JTL component at its output consisting of inductor L5_0, JJ b2_0, and bias signal bias4 provided via inductor L2_0, to provide additional amplification.

Each of the four-input gate designs 200, 300, 400, 500 consist of an amalgamation of essentially three two-input gates, using Boolean logic, to create larger gates, leveraging the logical equivalences of (AB)(CD)=ABCD in gate 200 as well as (A+B)+(C+D)=A+B+C+D in gate 300. Using the input and logical decision JJs of two two-input AND gates and combining them with the decision and driving portions of another AND gate, a four-input AND gate 200 is realized in FIG. 2A. A four-input OR gate 300 is realized similarly in FIG. 3A. In a similar fashion, by using the input and decision JJs of two two-input AND gates, and attaching them to the decision and driving portions of a two-input OR gate, the AND-OR gate structure 400 of FIG. 4A can be achieved, and by using two two-input OR gate front-ends and the back-end of an AND gate, the OR-AND gate structure 500 of FIG. 5A can be created. Prior to the invention of the gates in the present disclosure, the state of the art required using three independent two-input gates, as well as a Josephson transmission line in between the two two-input gates and the last two-input gate. The new four-input gates described herein make layouts smaller, and the gates themselves are faster than their multiple-gate counterparts. The new four-input gates reduce chip area of circuitry in RQL digital logic, which in turn reduces chip cost by allowing more circuits to be placed on chips. As a by-product, the circuits are also faster.

Figure 6A:
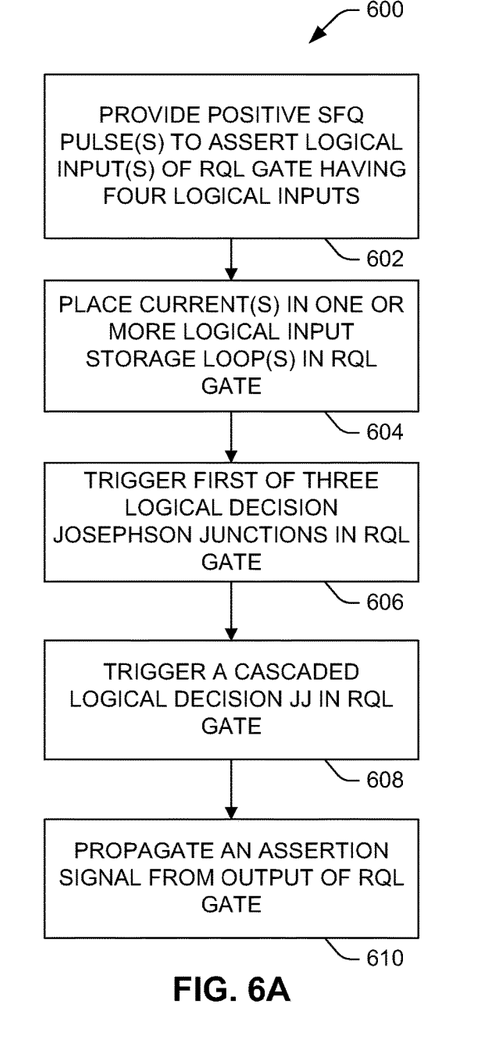
FIGS. 6A and 6B are flow diagrams of example methods of determining a logical output from a four-input RQL gate based on SFQ pulse inputs.

FIG. 6A shows method 600 of determining a logical output from an RQL gate having four logical inputs based on SFQ pulse inputs. Positive SFQ pulses are provided 602 to assert one or more logical inputs of an RQL gate having four logical inputs to place 604 one or more currents in one or more logical input storage loops associated with the asserted inputs, e.g., one loop per input, where the gate has four such logical input storage loops. The RQL gate can be, for example, like any of gates 100, 200, 300, 400, or 500 shown in FIGS. 1-5, or can be extensions of such examples. A logical decision JJ that is configured to trigger based on the assertion of a certain number or certain ones of the logical inputs then triggers 606. The JJ can be configured to trigger when at least one of two logical input storage loops have received positive SFQ pulses, thereby providing an OR function, or only when both of the two logical input storage loops have received positive SFQ pulses, thereby providing an AND logic function. The JJ can be so configured, for example, by making it common to two of the logical input storage loops in the RQL gate, by effectively tying to logical "high" or logical "low" additional inputs not counted among the logical inputs, by providing appropriate biasing, and/or by appropriate component sizing. A cascaded logical decision JJ, "downstream" of the previously triggered 606 JJ in the RQL gate in terms of logic flow, then triggers 608. An assertion signal, generated as a result of the triggering 608 of the cascaded logical decision JJ, then propagates 610 from an output of the RQL gate. The assertion signal can be, for example, a single SFQ pulse.

Figure 6B:
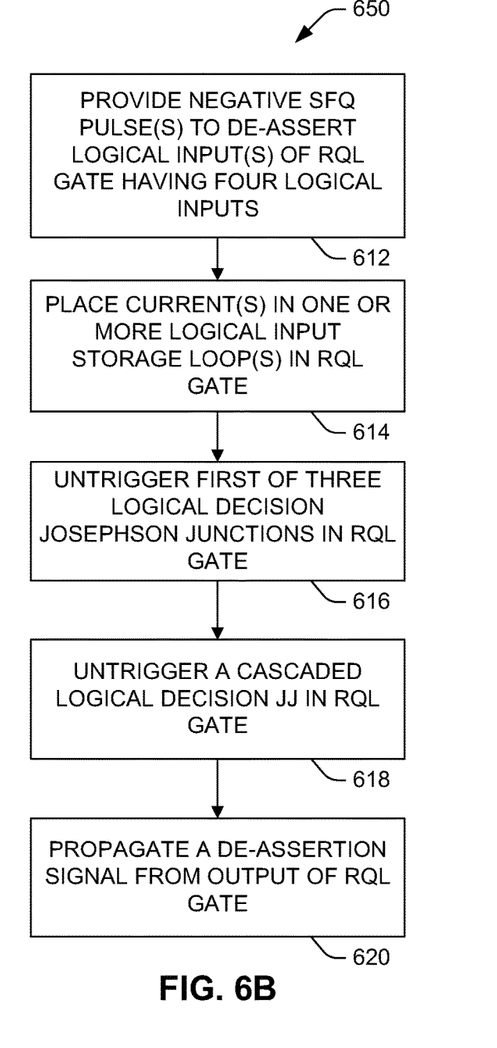

FIG. 6B shows method 650 of determining a logical output from an RQL gate having four logical inputs based on SFQ pulse inputs, which can continue from method 600 shown in FIG. 6A. Negative SFQ pulses are provided 612 to de-assert one or more logical inputs of an RQL gate having four logical inputs to place 614 one or more currents in one or more logical input storage loops associated with the asserted inputs, e.g., one loop per input, where the gate has four such logical input storage loops. The placed currents can be negative currents, i.e., currents equal and opposite to the currents placed 604 in method 600. Again, the RQL gate can be, for example, like any of gates 100, 200, 300, 400, or 500, shown in FIGS. 1-5, or can be extensions of such examples. A logical decision JJ that is configured to untrigger based on the de-assertion of a certain number or certain ones of the logical inputs then untriggers 616. The JJ can be configured to trigger when at least one of two logical input storage loops associated with previously asserted logical inputs have received negative SFQ pulses, thereby providing an AND function, or only when both of two logical input storage loops associated with previously asserted logical inputs have received negative SFQ pulses, thereby providing an OR logic function. The JJ can be so configured, for example, by making it common to two of the logical input storage loops, by effectively tying to logical "high" or logical "low" additional inputs not counted among the logical inputs, by providing appropriate biasing, and/or by appropriate component sizing. A cascaded logical decision JJ, "downstream" of the previously untriggered 616 JJ in the RQL gate in terms of logic flow, then untriggers 618. A de-assertion signal, generated as a result of the untriggering 618 of the cascaded logical decision JJ, then propagates 620 from an output of the RQL gate. The assertion signal can be, for example, a single SFQ pulse, e.g., a single negative SFQ pulse, opposite in direction to the pulse propagated 610 in method 600.

Figure 7:
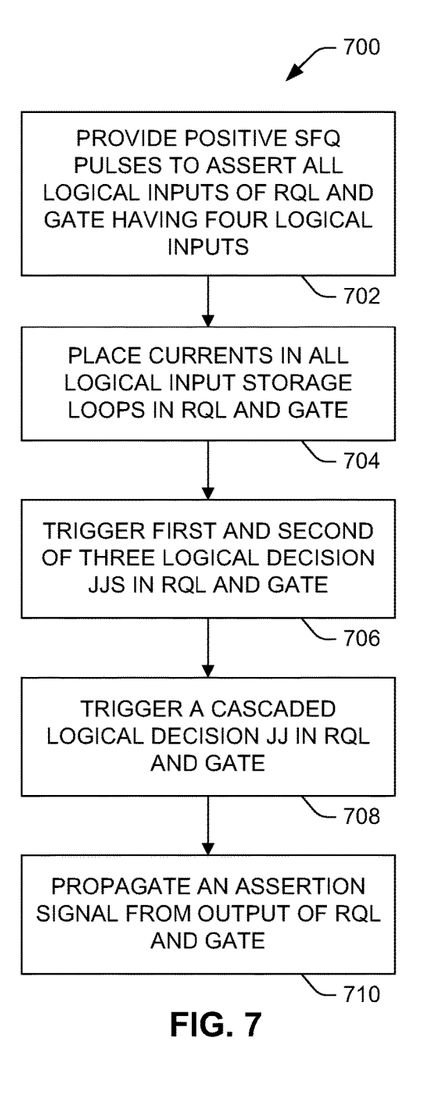
FIG. 7 is a flow diagram of an example method of determining a logical AND value based on SFQ pulse inputs.

FIG. 7 illustrates an example method 700 of determining a logical AND value based on four SFQ pulse inputs. Positive SFQ pulses are provided 702 to assert all of the logical inputs of an RQL AND gate having four logical inputs to place 704 currents in all four logical input storage loops associated with the asserted inputs, i.e., one loop per input. The RQL AND gate can be, for example, like gate 200 shown in FIG. 2A, or can be extensions of such example providing a greater number of inputs. First and second logical decision JJs trigger 706 based on the placement of currents 704. The first and second logical decision JJs can each be configured to trigger 706 based on the assertion of two of the logical inputs. The JJs can be so configured, for example, by making each of them common to both of the logical input storage loops associated with said inputs, by effectively tying to logical "low" an additional input to each JJ not counted among the logical inputs, by providing appropriate biasing, and/or by appropriate component sizing. A cascaded logical decision JJ, "downstream" of the previously triggered 706 JJs in the RQL gate in terms of logic flow, then triggers 708 based on the prior triggerings 706. An assertion signal, generated as a result of the triggering 708 of the cascaded logical decision JJ, then propagates 710 from an output of the RQL AND gate. The assertion signal can be, for example, a single SFQ pulse.

Figure 8:
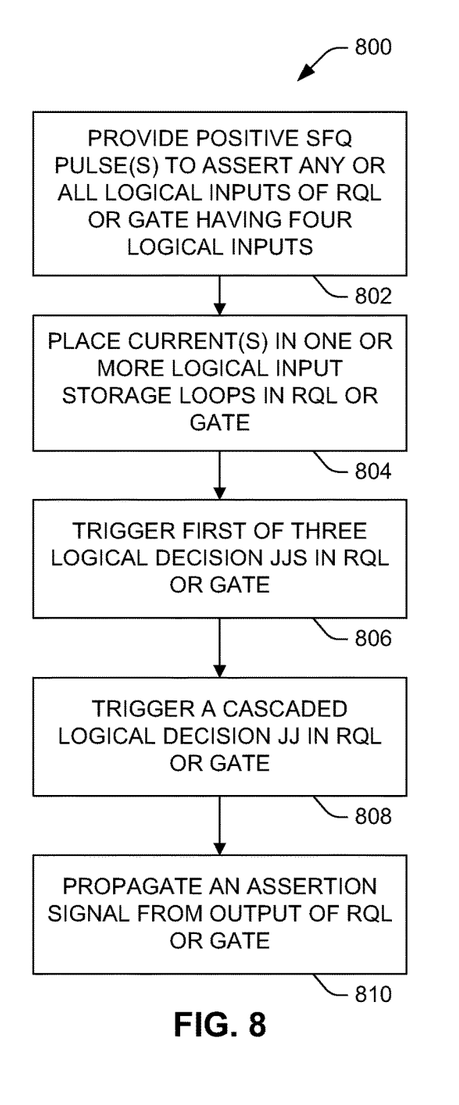
FIG. 8 is a flow diagram of an example method of determining a logical OR value based on SFQ pulse inputs.

FIG. 8 illustrates an example method 800 of determining a logical OR value based on SFQ pulse inputs. One or more positive SFQ pulses are provided 802 to assert any or all of the logical inputs of an RQL OR gate having four logical inputs to place 804 currents in one or more input storage loops associated with the asserted inputs, i.e., one loop per input. The RQL OR gate can be, for example, like gate 300 shown in FIG. 3A, or can be extensions of such example. A logical decision JJ triggers 806 based on the placement of the current(s) 804. The logical decision JJ can be configured to trigger 806 based on the assertion of at least one of two logical inputs. The JJ can be so configured, for example, by making it common to both of the logical input storage loops associated with said inputs, by effectively tying to logical "high" an additional input to the JJ not counted among the logical inputs, by providing appropriate biasing, and/or by appropriate component sizing. A cascaded logical decision JJ, "downstream" of the previously triggered 806 JJ in the RQL gate in terms of logic flow, then triggers 808 based on the prior triggering 806. An assertion signal, generated as a result of the triggering 808 of the cascaded logical decision JJ, then propagates 810 from an output of the RQL OR gate. The assertion signal can be, for example, a single SFQ pulse.

Figure 9:
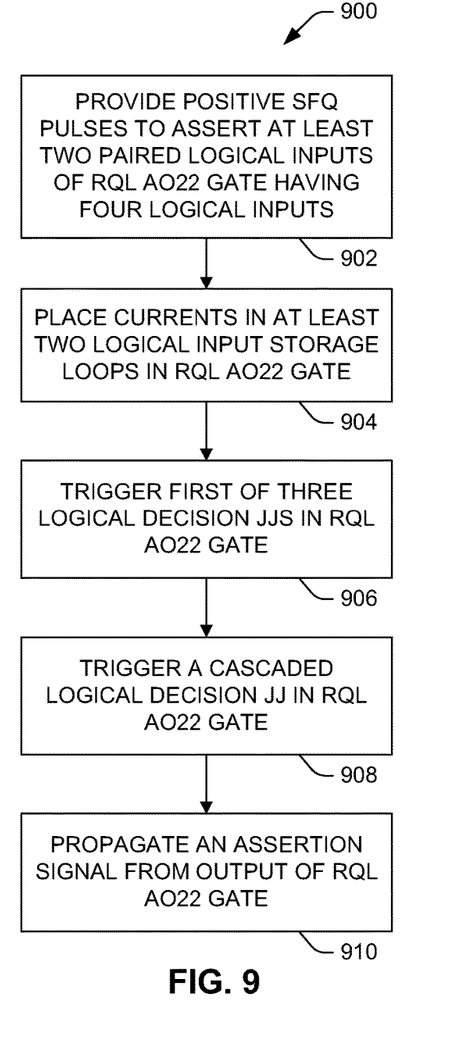
FIG. 9 is a flow diagram of an example method of determining a logical AND-OR value based on SFQ pulse inputs.

FIG. 9 illustrates an example method 900 of determining a logical AO22 value based on at least two SFQ pulse inputs. At least two positive SFQ pulses are provided 902 to assert at least two paired logical inputs of an RQL AO22 gate having four logical inputs arranged as two pairs of two logical inputs, thereby placing 904 currents at least two logical input storage loops associated with the asserted paired inputs, i.e., one loop per input. The RQL AO22 gate can be, for example, like gate 400 shown in FIG. 4A, or can be extensions of such example. A logical decision JJ triggers 906 based on the placement of the currents 904. The logical decision JJ can be configured to trigger 906 based on the assertion of both of the associated logical inputs. The JJ can be so configured, for example, by making it common to both of the logical input storage loops associated with said inputs, by effectively tying to logical "low" an additional input to the JJ not counted among the logical inputs, by providing appropriate biasing, and/or by appropriate component sizing. A cascaded logical decision JJ, "downstream" of the previously triggered 906 JJ in the RQL gate in terms of logic flow, then triggers 908 based on the prior triggering 906. An assertion signal, generated as a result of the triggering 908 of the cascaded logical decision JJ, then propagates 910 from an output of the RQL AO22 gate. The assertion signal can be, for example, a single SFQ pulse.

Figure 10:
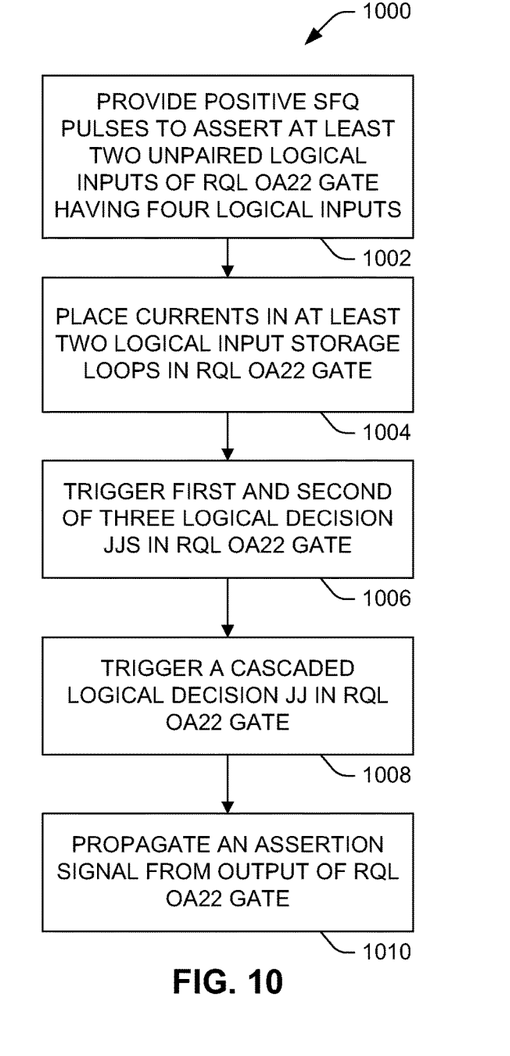
FIG. 10 is a flow diagram of an example method of determining a logical OR-AND value based on SFQ pulse inputs.

FIG. 10 illustrates an example method 1000 of determining a logical OA22 value based on at least two SFQ pulse inputs. At least two positive SFQ pulses are provided 1002 to assert at least two unpaired logical inputs of an RQL OA22 gate having four logical inputs arranged as two pairs of two logical inputs, thereby placing 1004 currents in at least two logical input storage loops associated with the asserted unpaired inputs, i.e., one loop per input. The RQL OA22 gate can be, for example, like gate 500 shown in FIG. 5A, or can be extensions of such example. First and second logical decision JJs trigger 1006 based on the placement 1004 of currents. The first and second logical decision JJs can each be configured to trigger 1006 based on the assertion of at least one associated logical input. Each JJ can be so configured, for example, by making it common to two associated logical input storage loops, by effectively tying to logical "high" an additional input not counted among the logical inputs, by providing appropriate biasing, and/or by appropriate component sizing. A cascaded logical decision JJ, "downstream" of the previously triggered 1006 JJs in the RQL gate in terms of logic flow, then triggers 1008 based on the prior triggerings 1006. An assertion signal, generated as a result of the triggering 1008 of the cascaded logical decision JJ, then propagates 1010 from an output of the RQL OA22 gate. The assertion signal can be, for example, a single SFQ pulse.

The four-input gates 200, 300, 400, 500 described herein are examples, but do not include all possible configurations. As shown by these examples, each stage may separately be configured to perform and AND, OR, or majority function. All combinations of these functions may be realized including all four-input combinations of AND and OR. If any stages are configured to perform a majority function, additional inputs can be added as the pseudo-inputs of the AND and OR gates become real primary inputs. The use of logic gates with four or more inputs, including the examples disclosed herein, can improve the efficiency and density of RQL logic. Gates that can implement larger logic functions allow reduced die sizes and, by extension, reduced cost per die. The logic gates described herein can operate according to RQL data encoding, where, for example, it would be impermissible for a logic gate to propagate two positive output pulses in a row or two negative output pulses in a row.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method of determining a logic value comprising:
   providing single flux quantum (SFQ) pulses to assert all logical inputs of a reciprocal quantum logic (RQL) AND gate having at least four logical inputs;
   placing currents in all input storage loops in the RQL gate;
   triggering a first and a second of three logical decision Josephson junctions (JJs) in the RQL gate, thereby triggering a third logical decision JJ of the three logical decision JJs in the RQL gate; and
   propagating an assertion signal from an output of the RQL AND gate.

2. The method of claim 1, further comprising, after the propagating:
   providing one or more SFQ pulses to de-assert at least one of the logical inputs, thereby affecting currents in one or more of the input storage loops; and
   untriggering at least one of the first or second logical decision JJ, thereby untriggering the third logical decision JJ; and
   propagating a de-assertion signal from the output of the RQL gate.

3. The method of claim 1, wherein the gate has exactly four logical inputs and four input storage loops.

4. The method of claim 1, wherein each storage loop comprises two JJs, at least one of them being one of the logical decision JJs, and a storage inductor.

5. The method of claim 4, wherein each of the logical decision JJs is shared between at least two storage loops.

6. A method of determining a logic value comprising:
   providing single flux quantum (SFQ) pulses to assert any logical input of a reciprocal quantum logic (RQL) OR gate having at least four logical inputs;
   placing currents in one or more input storage loops in the RQL gate;
   triggering either or both of a first or a second of three logical decision Josephson junctions (JJs) in the RQL gate, thereby triggering a third logical decision JJ of the three logical decision JJs in the RQL gate; and
   propagating an assertion signal from an output of the RQL OR gate.

7. The method of claim 6, further comprising, after the propagating:
   providing one or more SFQ pulses to de-assert all of the asserted logical inputs, thereby affecting currents in each of the input storage loops associated with the de-asserted logical inputs; and
   untriggering at least one of the first or second logical decision JJ, thereby untriggering the third logical decision JJ; and
   propagating a de-assertion signal from the output of the RQL gate.

8. The method of claim 6, wherein the gate has exactly four logical inputs and four input storage loops.

9. The method of claim 6, wherein each storage loop comprises two JJs, at least one of them being one of the logical decision JJs, and a storage inductor.

10. The method of claim 9, wherein each of the logical decision JJs is shared between at least two storage loops.

11. A method of determining a logic value comprising:
    providing single flux quantum (SFQ) pulses to assert at least two paired logical inputs of a reciprocal quantum logic (RQL) AO22 gate having at least four logical inputs;
    placing currents in at least two input storage loops in the RQL gate, the at least two input storage loops associated with the at least two paired logical inputs;
    triggering at least a first of three logical decision Josephson junctions (JJs) in the RQL gate, thereby triggering a third logical decision JJ of the three logical decision JJs in the RQL gate; and propagating an assertion signal from an output of the RQL AO22 gate.

12. The method of claim 11, further comprising, after the propagating:
providing one or more SFQ pulses to de-assert the asserted at least two paired logical inputs, thereby affecting currents in each of the input storage loops associated with the de-asserted logical inputs; and
untriggering at least the first logical decision JJ, thereby untriggering the third logical decision JJ; and
propagating a de-assertion signal from the output of the RQL gate.

13. The method of claim 11, wherein the first logical decision JJ is common to both of the at least two input storage loops associated with the at least two paired logical inputs.

14. The method of claim 11, wherein each storage loop comprises two JJs, at least one of them being one of the logical decision JJs, and a storage inductor.

15. The method of claim 14, wherein each of the logical decision JJs is shared between at least two storage loops.

16. A method of determining a logic value comprising:
providing single flux quantum (SFQ) pulses to assert at least two unpaired logical inputs of a reciprocal quantum logic (RQL) OA22 gate having at least four logical inputs;
placing currents in at least two input storage loops in the RQL gate, the at least two input storage loops associated with the at least two unpaired logical inputs;
triggering a first and a second of three logical decision Josephson junctions (JJs) in the RQL gate, thereby triggering a third logical decision JJ of the three logical decision JJs in the RQL gate; and
propagating an assertion signal from an output of the RQL OA22 gate.

17. The method of claim 16, further comprising, after the propagating:
providing one or more SFQ pulses to de-assert at least one of the asserted unpaired logical inputs, thereby affecting currents in one or more of the input storage loops; and
untriggering at least one of the first or second logical decision JJ, thereby untriggering the third logical decision JJ; and
propagating a de-assertion signal from the output of the RQL gate.

18. The method of claim 16, wherein the gate has exactly four logical inputs and four input storage loops.

19. The method of claim 16, wherein each storage loop comprises two JJs, at least one of them being one of the logical decision JJs, and a storage inductor.

20. The method of claim 19, wherein each of the logical decision JJs is shared between at least two storage loops.

* * * * *